United States Patent [19]
Dixit et al.

[11] Patent Number: 5,233,217
[45] Date of Patent: Aug. 3, 1993

[54] PLUG CONTACT WITH ANTIFUSE

[75] Inventors: Pankaj Dixit, San Jose; Monta R. Holzworth, Santa Clara; Richard Klein, Mountain View; William P. Ingram, III, Los Altos, all of Calif.

[73] Assignee: Crosspoint Solutions, Santa Clara, Calif.

[21] Appl. No.: 695,363

[22] Filed: May 3, 1991

[51] Int. Cl.⁵ .............................................. H01L 29/48
[52] U.S. Cl. ...................................... 257/530; 257/50; 257/751; 257/752; 257/764
[58] Field of Search ............... 357/2, 71; 257/50, 530, 257/751, 752, 764

[56] References Cited
U.S. PATENT DOCUMENTS

| | | |
|---|---|---|
| 3,571,673 | 3/1971 | Ovshinsky . |
| 3,675,090 | 7/1972 | Neale . |
| 3,877,049 | 4/1975 | Buckley ............................ 357/71 S |
| 4,361,599 | 11/1982 | Wourms ............................ 357/71 S |
| 4,442,507 | 4/1984 | Roesner . |
| 4,458,297 | 7/1984 | Stopper et al. . |
| 4,796,074 | 1/1989 | Roesner . |
| 4,914,055 | 4/1990 | Gordon et al. . |

Primary Examiner—Edward Wojciechowicz
Attorney, Agent, or Firm—Townsend and Townsend Khourie and Crew

[57] ABSTRACT

An antifuse particularly suitable for submicron geometries is presented. The antifuse is formed between a silicon layer, which could be a doped region of the semiconductor substrate, an epitaxial layer or a polysilicon layer, and an upper metal interconnection layer. In contact holes in a silicon dioxide layer insulating the silicon and metal interconnection layers from each other, the antifuses have a thick refractory metal layer having a top surface approximately at the same level as the top surface of the insulating layer. Depending upon the process used to deposit the refractory metal layer, a thin adhesion layer may be located immediately below the refractory metal layer. Between the underlying silicon layer and upper interconnection layer, a thin semiconductor material layer of amorphous silicon may be located either below the refractory metal layer or above it. At its bottom, the interconnection layer also has a barrier layer to prevent any intermixing between the amorphous silicon layer and the metal interconnection layer.

53 Claims, 6 Drawing Sheets

PLUG CONTACT WITH ANTIFUSE

BACKGROUND OF THE INVENTION

The present invention is related to semiconductor devices and, more particularly, to highly compact antifuses in integrated circuits.

An antifuse is a device which operates, as the name implies, in the opposite manner of a fuse. The antifuse lies between two conducting lines. If it is unprogrammed, or open, the antifuse forms a high-resistance electrical path. If the antifuse is programmed, or closed, it forms a low resistance electrical path between the conducting lines.

In integrated circuits, multiple layers of interconnecting conducting lines are stacked over each other. With insulating layers between the conducting lines, multilayer interconnect structures are formed. To make the interconnection between the two lowest conducting layers, the first conducting layer, which is typically a doped region in the integrated circuit substrate or a doped region of an epitaxial layer on the substrate, or a doped polysilicon layer over the substrate, is covered with an insulating layer. Then contact holes are formed through the insulating layer where the interconnection are desired. A second layer of conducting material is deposited over the insulating layer and the contact holes to make the electrical interconnection. By standard semiconductor processing techniques, the second conducting layer is masked, etched and defined into a conducting line. The second conducting line is typically formed from an aluminum alloy deposited by a sputtering process.

It is in these contact holes that certain types of antifuse structures with near-ideal electrical characteristics may be created. Examples of such antifuse structures are described in a U.S. patent application, filed on Mar. 20, 1991 by the present applicants and assigned to the present assignee, entitled "IMPROVED METHOD OF FABRICATING ANTIFUSES IN AN INTEGRATED CIRCUIT DEVICE AND RESULTING STRUCTURE."

However, as contact hole dimensions have become smaller and smaller, and the desire for greater packing densities has increased, the sidewall angles of the contact holes have become more vertical. Thus the sidewall step coverage of the aluminum layer becomes less and less reliable to the point that a complete discontinuity in the layer becomes possible. This is a major problem limiting yield on sub-micron integrated circuits.

Since the antifuses noted above lie in the contact holes, they must also shrink with contact holes. The antifuse in their current form cannot be manufactured reliably with critical dimensions of smaller than one micron. The present invention makes it possible to manufacture antifuses beyond that limit. The present invention offers highly compact antifuses having integrity in step coverage and highly desirable electrical characteristics.

SUMMARY OF THE INVENTION

The present invention provides for an antifuse in an integrated circuit device. The antifuse has a first conducting layer, either a doped polysilicon layer, a doped region of the integrated circuit substrate or of the epitaxial silicon on the substrate. A relatively thick insulating layer of silicon dioxide is formed over the silicon layer with an opening for contact to the silicon layer. In the opening at the top surface of the silicon layer, a region of metal silicide is formed. Covering the metal silicide region is a relatively thin amorphous silicon layer in the opening. A thick refractory metal layer fills the rest of the opening so that the top surface of said refractory metal layer is substantially level with the top surface of said insulating layer. The thick metal layer forms a conducting plug in the contact opening. A second conducting layer covers the top surfaces of the insulating layer and the thick refractory metal layer. The antifuse is thus formed between the silicon layer and the second conducting layer.

In another embodiment of the present invention, the position of the thin amorphous silicon layer is reversed with respect to the thick refractory metal layer so that the silicon layer lies on top of the refractory metal layer.

BRIEF DESCRIPTION OF THE DRAWINGS

A more detailed understanding of the present invention may be achieved by a perusal of the following detailed description of specific embodiments with reference to follow the drawings.

DETAILED DESCRIPTION OF SPECIFIC EMBODIMENTS

To avoid the problems of step coverage which have been described above, one proposed solution has been the use of contact "plugs," especially in the finer geometry integrated circuits, such as devices having critical dimensions smaller than one micron. These contact plugs help achieve tight critical dimensions, higher densities and better interconnect step coverage in the integrated circuit.

In this technology, a metal plug is used to fill a contact hole in the insulating layer and to make the electrical connection between the lower conducting layer and the upper conducting layer. Because the upper conducting layer is deposited over the insulating layer and the top of the plug which is more or less level with the top surface of the insulating layer, step coverage problems are reduced.

With this approach to solving step coverage problems over contact holes, the present invention offers an innovative antifuse and method of manufacturing the antifuse highly suitable for sub-micron geometries.

The steps in the process of manufacturing an antifuse (and standard contact) according to the present invention are illustrated in FIGS. 1A to 1G. In the initial step shown in FIG. 1A, the silicon layer 10, either a doped region in a semiconductor substrate, a polysilicon layer or an epitaxial silicon layer on the substrate, as explained previously, is formed with a covering insulating layer 11 of silicon dioxide with a thickness in a range from 5000 to 15000 Angstroms. Typically the layer 11 is deposited by chemical vapor deposition and may be undoped silicate glass, borophosphosilicate glass (BPSG), or phosphosilicate glass (PSG). Then the contact openings 12A and 12B are formed by standard photolithographic and etching techniques in the layer 11 where antifuse and standard contacts are desired to the layer 10 below.

Figure 1A:
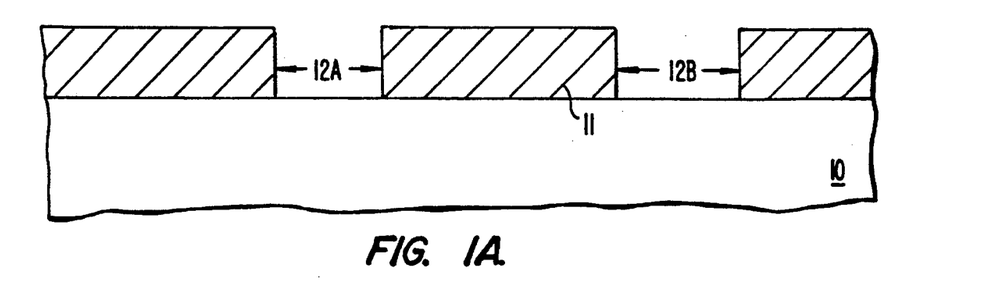
FIGS. 1A-1G are cross-sectional views of the various steps used to manufacture the antifuse of the present invention.
Figure 1B:
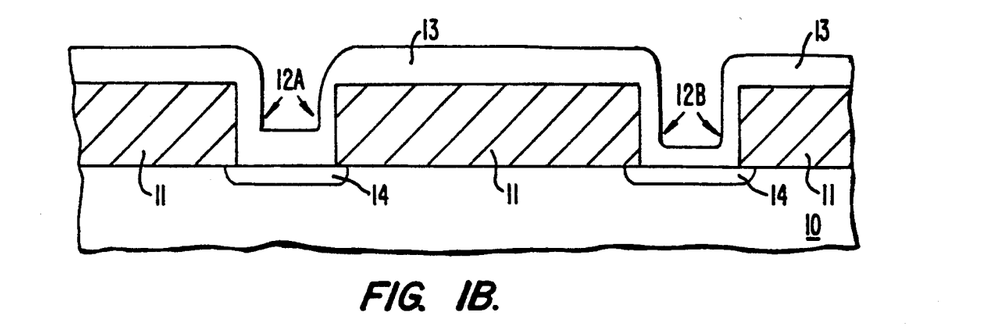

The layer 11 is then covered by a platinum layer 13, as shown in FIG. 1B, by sputtering. By an annealing step, the processing temperature is elevated to 450° to 700° C. so that the platinum reacts with the underlying silicon 10 to form platinum silicide regions 14 in the holes 12A and 12B at the platinum-silicon interface as illustrated in FIG. 1B. The regions 14 make very good electrical contact with the subsequent upper layers and also act as a diffusion barrier for substrate dopants. After the compound region 14 is formed, the refractory metal layer 13 is removed completely by a selective etchant, such as aqua regia.

Figure 1C:
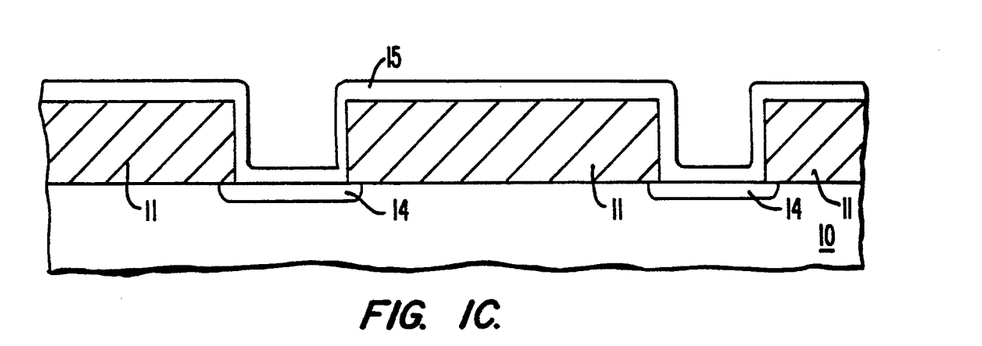

Then a thin layer 15 of semiconductor material, amorphous silicon, is deposited over the insulating layer 11 and into the openings 12A and 12B, as shown in FIG. 1C. The layer 15 has a thickness in the range of 500 to 1500 Angstroms where it is in contact with the region 14. A thickness of 800 Angstroms is considered optimal. Standard deposition techniques may be used to lay down the layer 15. By standard photolithographic and etching processes, the layer 15 is then defined so as to cover only the holes 12A in which antifuses are to be formed. Around such openings 12A the edges of the remaining material 15 extend onto the top surface of the insulating layer 11 to compensate for alignment errors and to ensure such coverage of the platinum silicide region 14 and silicon layer 10 below.

Figure 1D:
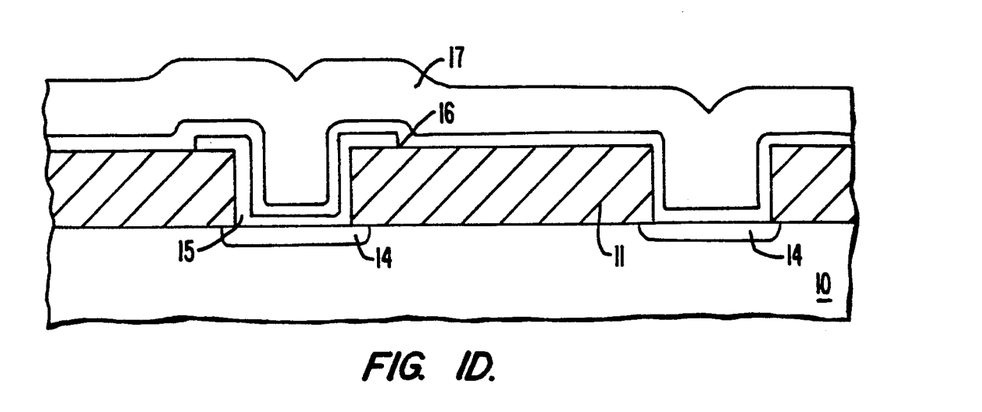

Then over all the contact holes 12A and 12B, a thin blanket layer 16 of titanium-tungsten alloy (TiW) is deposited, followed by the blanket deposition of a thick refractory metal layer 17 of tungsten, as shown in FIG. 1D. The layer 16 acts as a nucleating and an adhesion layer for the refractory metal layer 17. Without the layer 16, the tungsten layer 17, which does not adhere well to silicon dioxide, may peel off from the top surface of the oxide layer 11 during processing.

In place of titanium-tungsten, titanium nitride may be used for the layer 16. Another alternative is a double layer of titanium followed by titanium nitride for the layer 16. The titanium adheres well to silicon dioxide and the titanium nitride compound adheres well to tungsten. The lower titanium layer may be thin, approximately, 300 Angstroms, and the titanium nitride layer may be from a few hundred to 1000 Angstroms thick.

Figure 1E:
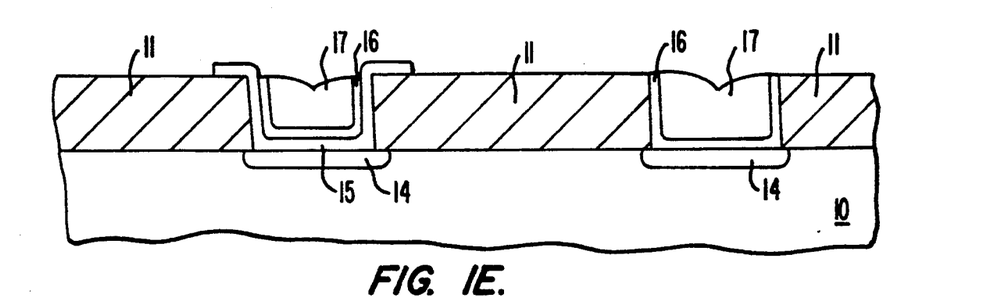

As shown in FIG. 1E, the layer 17 and 16 are then etched back to leave the tungsten layer 17 and the layer 16 within the contact hole 12 only. An etchant of fluorine-based chemistry, such as SF$_6$, may be used to etch the layers 16 and 17. The etching operation is performed so that the top of the tungsten layer 17 is approximately level with the top surface of the insulating layer 11. The layer 17 is now a plug.

After the etch back step, a barrier layer 18 of titanium-tungsten alloy (TiW) is deposited. This is followed by a thick layer 19 of aluminum alloy, typically 6000 to 12000 Angstroms thick. The barrier layer 18, which is relatively thin, from 500 to 1500 Angstroms with 800 Angstroms being typical, prevents the aluminum of the layer 19 from interdiffusing with the silicon of the layer 15 and makes a good contact with the tungsten plug, the layer 17. The antifuse at this stage is shown on the left of FIG. 1F and a standard contact on the right.

Figure 1F:
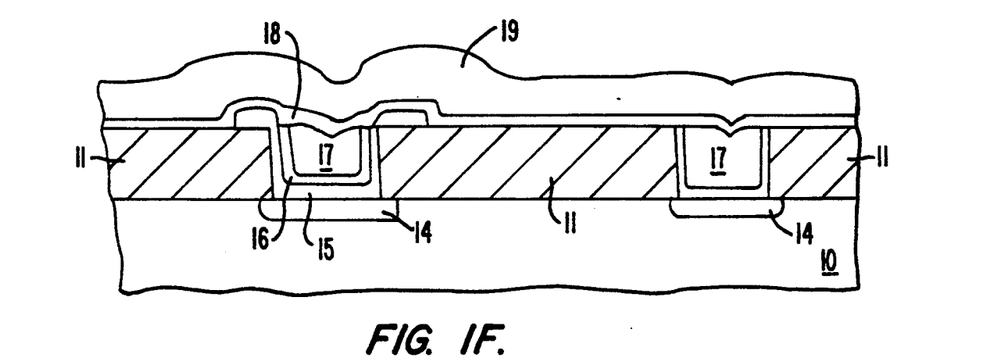

Alternative materials for the barrier layer 18 include titanium nitride and dual layers of titanium and titanium nitride.

Figure 1G:
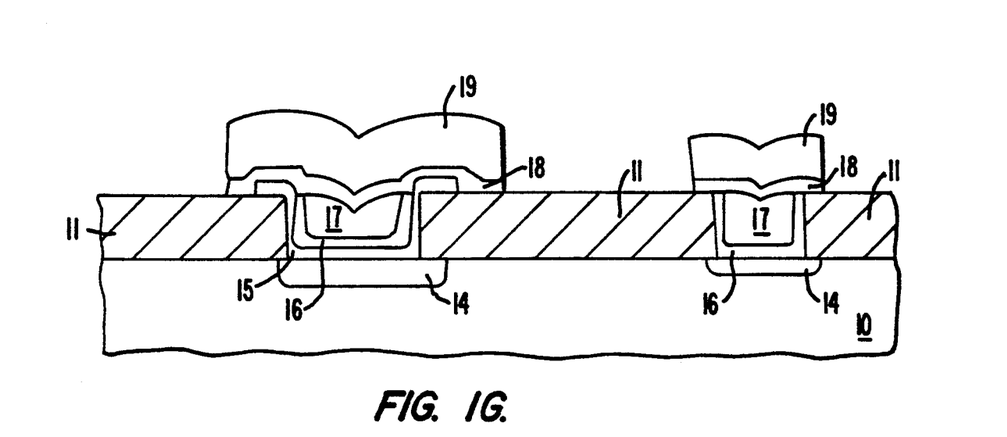

Then by standard photolithographic processes the barrier layer 18 and aluminum alloy layer 19 which forms the upper conducting layer are defined to complete the antifuse and the standard contact as represented in FIG. 1G. The two layers 18 and 19 are defined coextensively such that the edges of the amorphous silicon layer 15 on the insulating layer 11 are completely covered by the layer 18 and 19. The barrier layer 18 isolates the aluminum layer 19 from the silicon layer 15.

An alternative step to the blanket deposition of the thick refractory metal layer 17, which forms the plugs in the contact holes 12A and 12B, is a selective deposition of the refractory metal. Tungsten is deposited in the contact holes 12A and 12B where platinum silicide regions 14 are exposed and not on the silicon dioxide surface. Selective deposition techniques, such as low-pressure chemical vapor deposition which are suitable for deposition at low processing temperatures, are known to those skilled in the semiconductor processing field. In such a step, the adhesion layer 16 is not required and is eliminated from the process.

In the completed antifuse shown in FIG. 1G, the amorphous silicon layer 15 in the antifuse acts as a high-resistance barrier between the conducting layers 10 and 19 unless the antifuse is programmed. When the antifuse is programmed by a large voltage across the amorphous silicon layer 15, the programming voltage breaks down the amorphous silicon layer 15 and the following sustained heavy current changes the layer, which had been in a high resistance state, to a low resistance state.

This antifuse has many desirable operating characteristics. For example, the antifuse has typically a high unprogrammed resistance ($R_{OFF}$) of $1 \times 10^9 \Omega$, a low programmed resistance ($R_{ON}$) of 100 ohms, a low programming voltage of 8 volts, and a short programming time of typically 100 microseconds. The antifuse can be programmed quickly and at a low voltage, which are highly desirable features. Furthermore, as contacts get smaller, the differential between $R_{ON}$ and $R_{OFF}$ is expected to desirably increase.

Figure 2A:
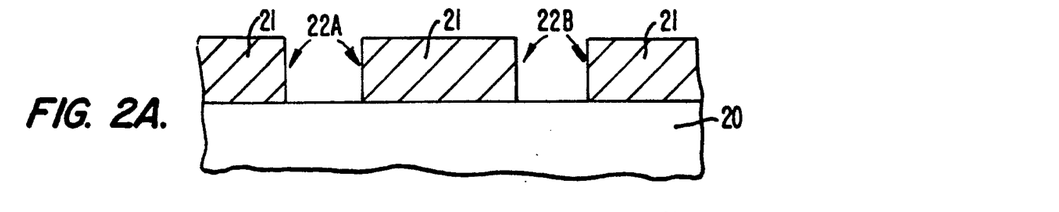
FIGS. 2A-2L are cross-sectional views of the various steps used to manufacture another embodiment of the present invention.

Another embodiment of the present invention is illustrated in FIGS. 2A–2K. As shown in FIG. 2A, the process starts with the formation of contact holes 22A and 22B in an insulating layer 21 on a silicon layer 20. As described previously, the silicon layer 20 may be either a doped region in a semiconductor substrate, a polysilicon layer or an epitaxial silicon layer on the substrate. Some of the contact holes are used for standard contacts and others are used for the antifuses. As in the previous drawings, the contact hole 22B of the right represents the standard contact and the one 22A on the left represents the those used for the antifuses.

Figure 2B:
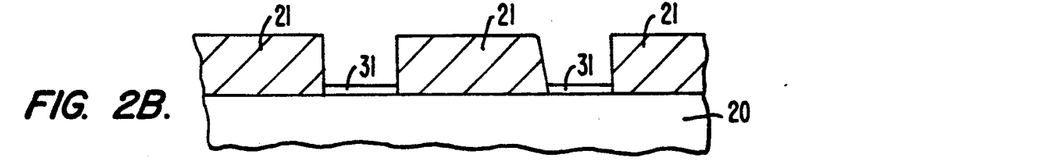

Next, as illustrated in FIG. 2B, an oxidizing step is used to grow an oxide layer 31 over the exposed silicon in the contact holes in the insulating layer 21. Typically the oxide layer 31 is grown to a thickness of a few hundred Angstroms, with 200 Angstroms being optimal.

Figure 2C:
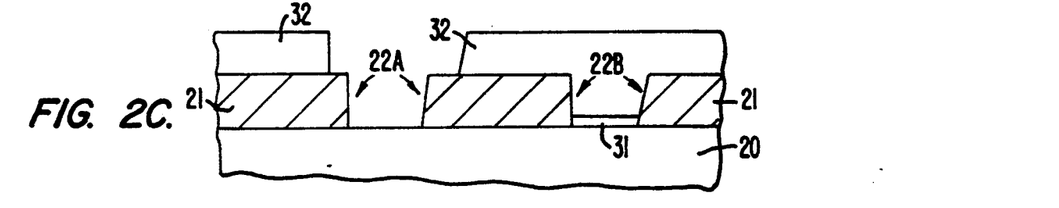

A photoresist layer 32 is then deposited over the layer 20 and the insulating layer 21. By standard photolithography and etching methods, the layer 21 is defined so that the contact holes 22A for the antifuses are exposed and the contact holes 22B for the standard contacts are covered. By a HF dip etching step, the thin oxide layer 31 is removed from the contact holes for the antifuse to expose the silicon. This is shown in FIG. 2C.

Figure 2D:
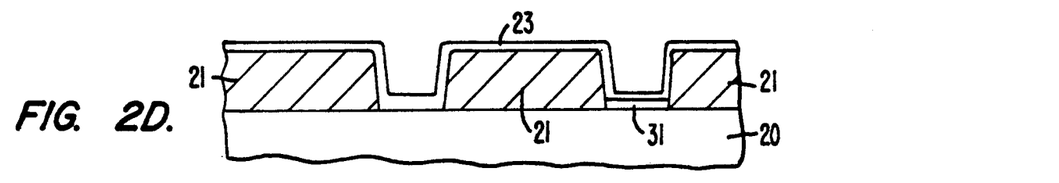

The photoresist layer 32 is then stripped and a layer 23 of titanium from 300–1000 Angstroms thick is sputtered over the layer 20 and the oxide layer 21, as illustrated in FIG. 2D. Other refractory metals, such as tantalum, tungsten, and molybdenum, or cobalt may be substituted for titanium.

Figure 2E:
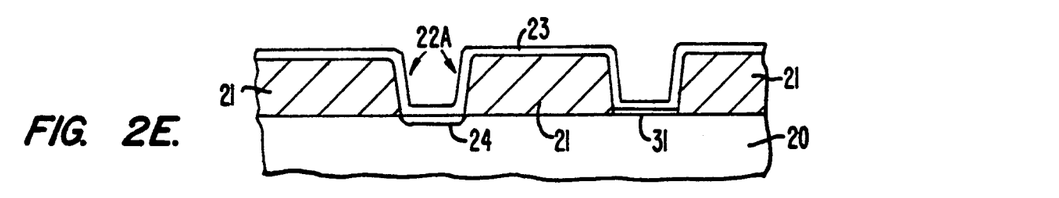

The wafer is then heated to a temperature of approximately 600–750 degrees Centigrade for 10–60 seconds in a rapid thermal anneal system for a reaction at the titanium-silicon interface. Alternatively this heating can be carried in a furnace tube. As shown in FIG. 2E, a titanium silicide layer 24 is formed in the contact hole 22A where an antifuse is to be formed.

Figure 2F:
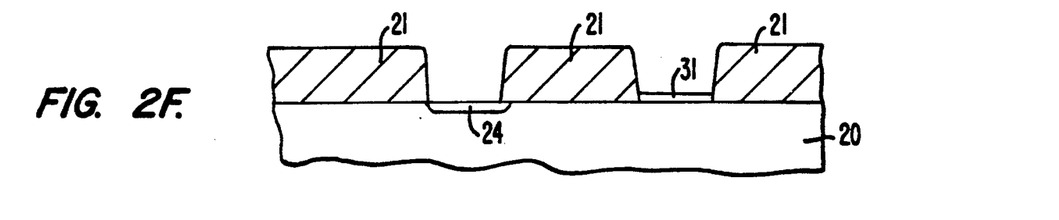

The unreacted titanium from the layer 23 is then stripped off with either a mixture of ammonium hydroxide and hydrogen peroxide ($NH_4OH + H_2O_2$) or sulfuric acid and hydrogen peroxide ($H_2SO_4 + H_2O_2$). After the unreacted titanium is removed, as illustrated in FIG. 2F, the wafer is heated once again to a temperature of approximately 750–900 degrees Centigrade to ensure that all of the titanium in the layer 24 has completely reacted with the silicon to form $TiSi_2$.

Figure 2G:
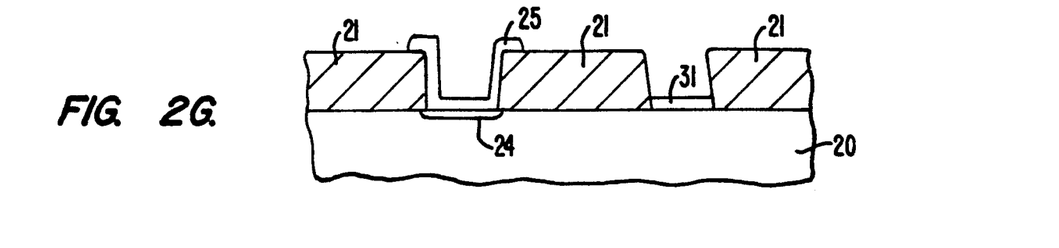
Figure 2H:
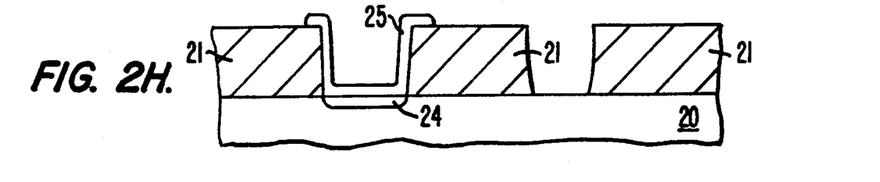

Then a thin semiconductor material layer 25 of amorphous silicon, approximately 800 Angstroms thick, is deposited, as described with respect to the previous antifuse. After a photoresist layer (not shown) is deposited, an antifuse mask having an overlap with the contact hole mask defines portions of the silicon layer 25 to completely cover the antifuse contact holes 22A. By an etching step, the amorphous silicon layer 25 is removed over the standard contact holes. The result is shown in FIG. 2G. The oxide layer 31 in these holes acts as an etch stop and prevents etching into the silicon layer 20. The portion of the amorphous silicon layer 25 covering the antifuse contact holes is left. Then the photoresist layer (not shown) is stripped off. With a HF dip, the oxide layer 31 is removed. The result is shown in FIG. 2H.

Figure 2I:
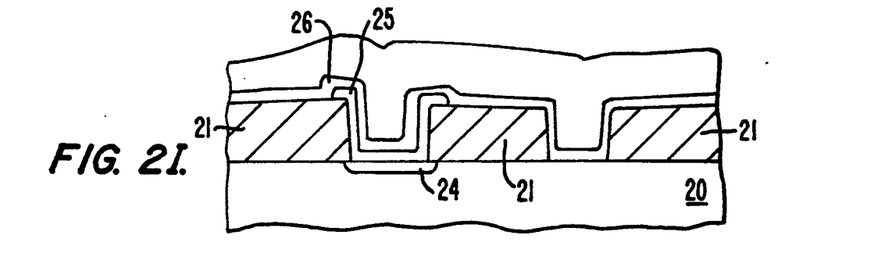

Next, a thin layer 26 of titanium-tungsten alloy is deposited and followed by the deposition of a thick refractory metal layer 27 of tungsten, as shown in FIG. 2I. The layer 26 acts as a nucleating and adhesion layer for the tungsten layer 27. Without the layer 26, the tungsten layer 27 may peel off from the top surface of the silicon dioxide layer 21 during subsequent processing.

Alternatives for the thin layer 26 include a layer of titanium nitride, or a dual layer of titanium and followed by titanium nitride. As explained previously, titanium adheres well to silicon dioxide and makes a good contact to silicon. The titanium nitride compound adheres well to tungsten. The lower titanium layer may be thin, approximately, 300 Angstroms, and the titanium nitride layer may be from a few hundred to 1000 Angstroms thick.

Figure 2J:
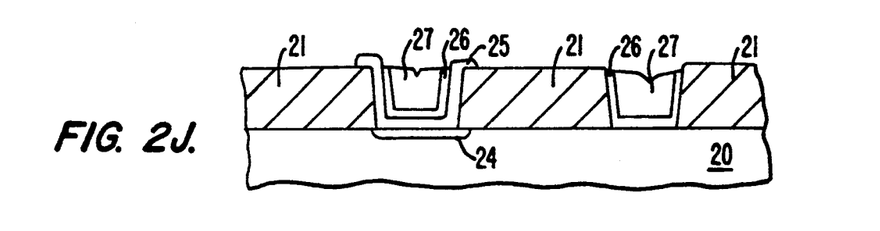

As shown in FIG. 2J, the layers 27 and 26 are then etched back to leave the tungsten layer 27 and the titanium-tungsten layer 26 within the openings 22a and 22b only. An etchant of fluorine-based chemistry, such as $SF_6$ may be used to etch the layers 26 and 27. The etching operation is performed so that the top of the tungsten layer 27 is approximately level with the top surface of the insulating layer 21. The layer 27 is now a plug.

Figure 2K:
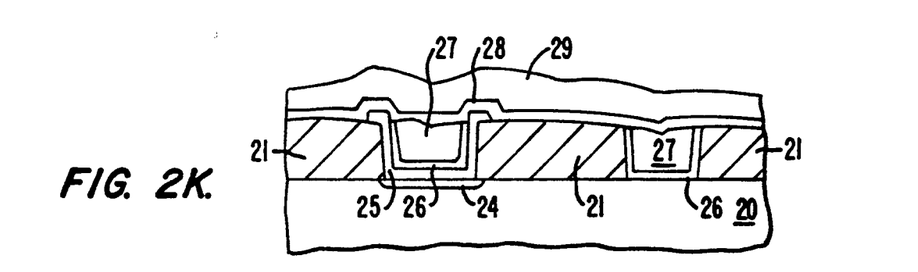

After the etch back step, a barrier layer 28 of titanium-tungsten alloy (TiW) is deposited. This is followed by a thick layer 29 of aluminum alloy, typically from 6000 to 12000 Angstroms thick. As noted previously, the barrier layer 28, which is relatively thin, from 500 to 1500 Angstroms with 800 Angstroms typical, prevents the aluminum of the layer 29 from interdiffusing with the silicon of the layer 25 and makes a good contact with the tungsten plug, the layer 27. This stage of the process is shown in FIG. 2K.

Alternative materials for the barrier layer 28 include titanium nitride and dual layers of titanium and titanium nitride.

Figure 2L:
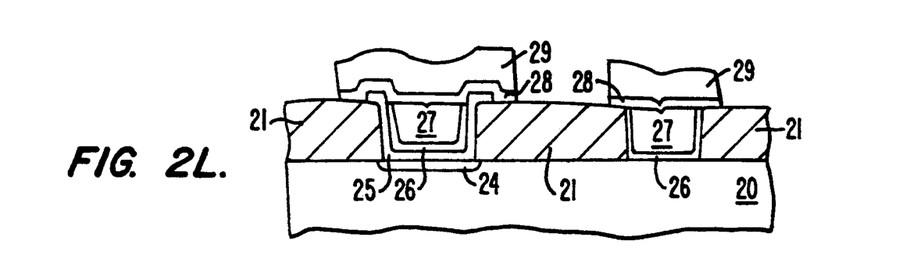

Then, by standard photolithographic processes the barrier layer 28 and aluminum layer 29 which forms the upper conducting interconnection layer are defined to complete the antifuse. Again the barrier layer 28 and aluminum layer 29 are defined coextensively to protect the amorphous silicon layer 25 from the layer 29. The antifuse is shown on the left in FIG. 2L, while the standard contact is shown on the right.

An alternative to the blanket deposition of the refractory metal layer 27 described previously is the selective deposition of tungsten. In the selective deposition of tungsten, the metal is deposited only in the contact holes 22A and 22B where silicon is exposed and not on the silicon dioxide surface.

If selective deposition of tungsten is used to form the plugs, the adhesion layer 26 is not required and is eliminated from the process, and therefore from the final antifuse and standard contact.

It should be noted that in the embodiment of the present invention just described, no platinum was used. Platinum is an expensive material to use in any semiconductor process and a cost savings is achieved in this embodiment and later embodiments of the present invention described below.

In another embodiment of the present invention the placement of the amorphous silicon layer is inverted from the antifuses previously described; the amorphous silicon layer is placed above the tungsten plug.

As in the previously described processes, contact holes 42A and 42B for antifuses and standard contacts are formed in an insulating silicon dioxide layer 41 which covers a silicon layer 40 as shown in FIGS. 3A to 3D. As before, the layer 40 may be a doped region in a semiconductor substrate, a polysilicon layer or an epitaxial layer on the substrate on the substrate Then over the insulating layer 41 and exposed silicon in the contact holes 42A and 42B, an adhesion layer 46 of titanium-tungsten alloy is deposited by sputtering. The layer 46 helps the tungsten layer to follow to adhere to the silicon dioxide insulating layer 41. Again, a thin layer of titanium nitride or a dual layer of titanium and titanium nitride may also be used for the layer 46.

Figure 3A:
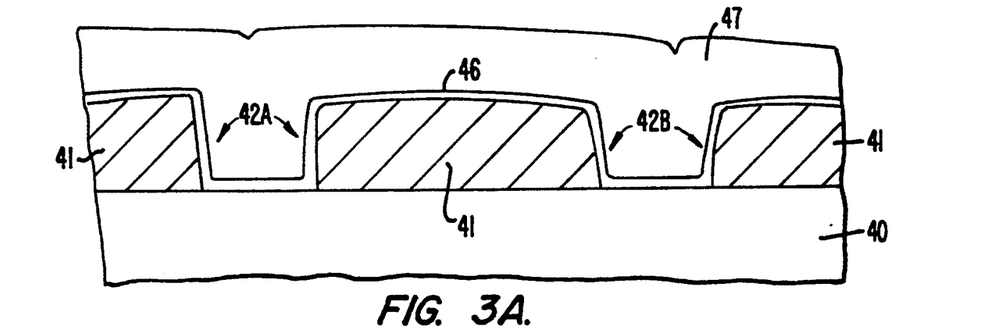
FIGS. 3A to 3D are cross-sectional views of the various steps used to manufacture still an embodiment of the present invention in which the structure of the antifuse is inverted compared to the antifuses illustrated in FIGS. 1A to 1G and FIGS. 2A to 2L.

Then a thick blanket layer 47 of refractory metal tungsten is deposited by chemical vapor deposition to completely fill the contact holes 42A and 42B. This is illustrated in FIG. 3A.

Figure 3B:
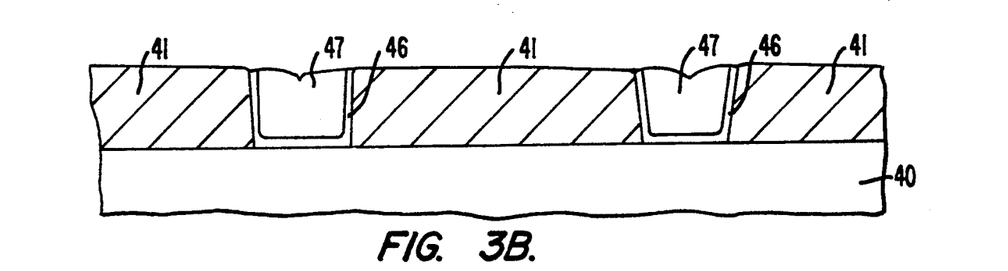

The tungsten layer 47 is etched back until the top surface of the layer 47 is substantially even with the top surface of the insulating layer 41, as shown in FIG. 3B. The remnants of the tungsten layer 47 form the plugs in the contact holes 42A and 42B.

Figure 3C:
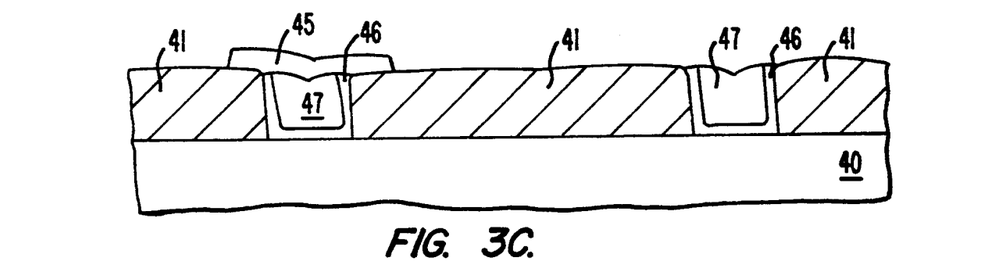

A semiconductor material layer 45 of amorphous silicon is deposited over the surface of the insulating 41 and the tops of the remnants of the tungsten layer 47. By standard photolithography and etching techniques, only the portions of the layer 45 over the contact holes 42A where antifuses are to be formed are left. The remaining portions of the silicon layer 45 completely cover the tungsten plugs of the layer 47. To compensate for alignment error, the remaining silicon layer 45 is defined so that the layer 45 extends from the tungsten plugs to the top surface of the insulating layer 41 around the periphery of the contact holes 42A. This is shown in FIG. 3C.

A blanket deposition of a barrier metal layer 48 of titanium-tungsten is then made. This is followed by a blanket deposition of aluminum alloy layer 49. As explained previously, the layer 48 prevents the aluminum from the layer 49 from undesirably mixing with the silicon in the layer 45. Other suitable materials for the layer 48 include titanium-nitride and a dual layer of titanium and titanium nitride.

Figure 3D:
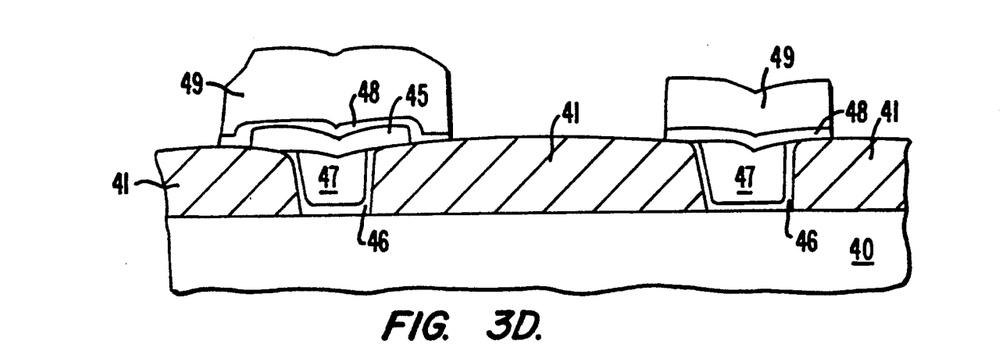

The aluminum layer 49 and barrier metal layer 48 are then masked and etched to define a metal interconnection layer. As shown in FIG. 3D, an antifuse is shown on the left and a standard contact on the right.

Another inverted antifuse is created with the process illustrated in FIGS. 4A to 4E. Again the process starts with the creation of contact holes 52A and 52B through an insulating layer 51 over a silicon layer 50, which could be a doped region in a semiconductor substrate, a epitaxial layer on the substrate or a polysilicon layer over the substrate. As before, the contact holes 52A represent the locations where antifuses are to be formed and the contact holes 52B represent the locations where standard contacts between an upper interconnection layer and the silicon layer 50 are to be made.

Figure 4A:
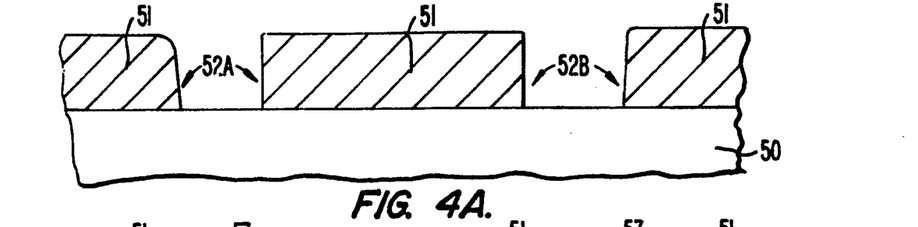
FIGS. 4A to 4E are cross-sectional views of the various steps used to manufacture still another embodiment of the present invention.
Figure 4B:
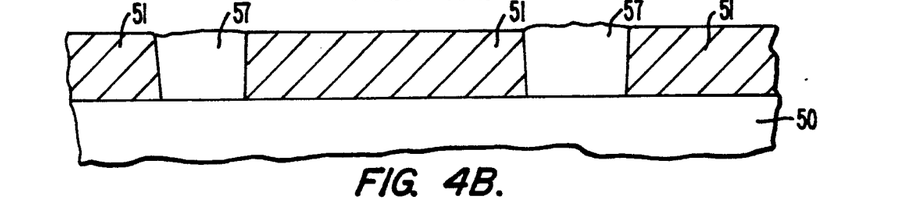

At low processing temperatures, refractory metal tungsten is selectively deposited by low-pressure chemical vapor deposition into the contact holes 52A and 52B to fill them such that the tops of the tungsten layers 57 are substantially level with the top of the insulating layer 41, as shown in FIG. 4B. The refractory metal layers 57 form plugs in the contact holes 52A and 52B.

It should be noted again that since tungsten is selectively deposited, an adhesion layer, such layer 46 in the process immediately above, is not required.

Figure 4C:
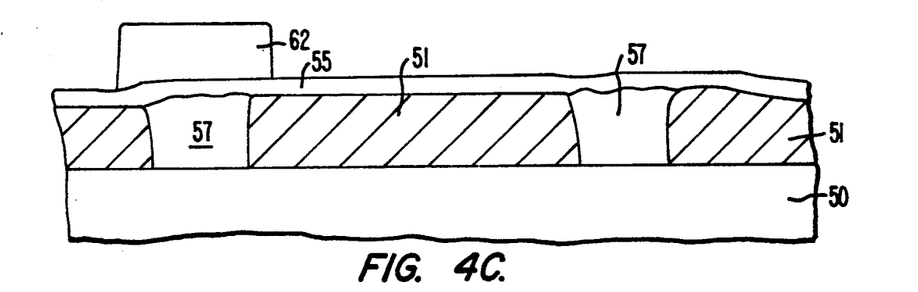

A blanket deposition of an amorphous silicon layer 55 follows. A layer 62 of photoresist is then deposited and defined by a photomask and etched so that the contact holes 52A where antifuses are to be formed are covered by the photoresist layer 62, as shown in FIG. 4C. The exposed portions of the amorphous silicon layer 55 are then etched away. The remaining portions of the layer 55 completely cover the layers 57 in the holes 52A and extend over the top surface of the insulating layer 51.

Figure 4D:
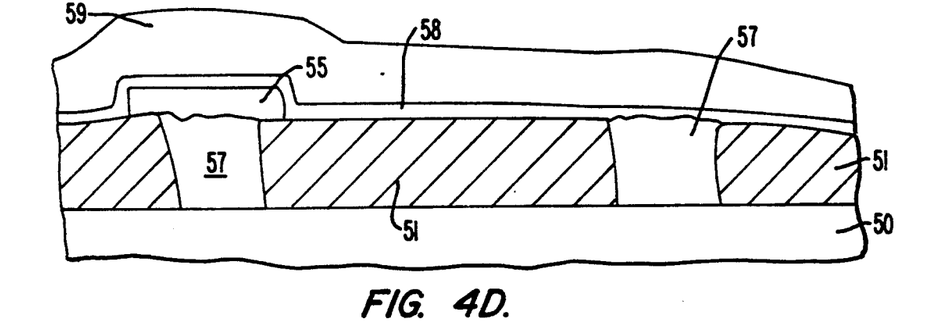

Then a blanket deposition of a barrier metal layer 58 is performed, followed by a blanket deposition of an aluminum alloy layer 59. The results are illustrated in FIG. 4D. As noted previously, the barrier metal layer 58 may be titanium-tungsten, titanium nitride, or a dual layer of titanium and titanium nitride.

Figure 4E:
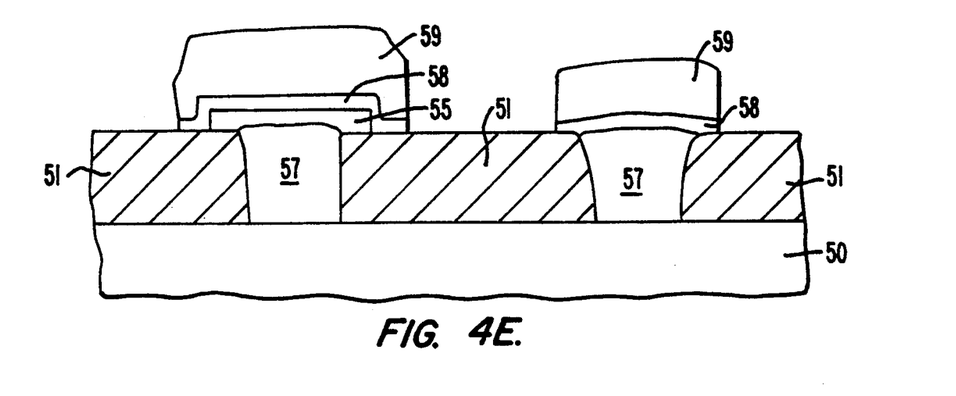

The layers 58 and 59 are then masked and etched to define a metal interconnection layer. As shown in FIG. 4E, an antifuse is shown on the left and a standard contact on the right.

It should be noted that for some of the steps in the processes described above, more details may gleaned from the U.S. patent application noted above.

It should be further noted that only the antifuse and the steps used to build the antifuse have been shown. None of the earlier steps in the process, such as those used to build the transistors of the integrated circuit, nor those later steps, such as those used to build the upper interconnection and passivation layers, are shown.

Therefore the present invention can be easily adapted to fit into the many process technologies, such as CMOS, BiCMOS, NMOS and bipolar, by those familiar with semiconductor processing.

While the above is a complete description of the preferred embodiments of the invention, various alternatives, modifications and equivalents may be used. It should be evident that the present invention is equally applicable by making appropriate modifications to the embodiments described above. Therefore, the above description should not be taken as limiting the scope of the invention which is defined by the appended claims.

What is claimed is:

1. An antifuse in an integrated circuit device, said integrated circuit device formed within and on a semiconductor substrate, said antifuse comprising a silicon layer, said silicon layer having a top surface, said top surface having a region of metal silicide;

a relatively thick insulating layer over said silicon layer, said insulating layer having a top surface and an opening to said metal silicide region of said silicon layer top surface;

a relatively thin layer of amorphous silicon in said opening, said amorphous silicon layer covering said metal silicide region;

a refractory metal layer in said opening, said refractory metal layer having a top surface and filling said opening so that said top surface of said refractory metal layer is substantially at the same level as said top surface of said insulating layer; and a metal interconnection layer on said top surfaces of said insulating layer and said refractory metal layer;

whereby said antifuse is formed between said silicon layer and said metal interconnection layer.

2. An antifuse as in claim 1 wherein said silicon layer comprises said semiconductor substrate.

3. An antifuse as in claim 1 wherein said silicon layer comprises a layer of epitaxial silicon.

4. An antifuse as in claim 1 wherein said silicon layer comprises a layer of polysilicon.

5. An antifuse as in claim 1 wherein said metal silicide region comprises platinum.

6. An antifuse as in claim 1 wherein said amorphous silicon layer is in the range of 500 to 1500 Angstroms thick.

7. An antifuse as in claim 6 wherein said amorphous silicon layer is approximately 800 Angstroms thick.

8. An antifuse as in claim 1 wherein said amorphous silicon layer comprises hydrogen in the range of 5 to 20% by composition.

9. An antifuse as in claim 1 wherein said amorphous silicon layer extends onto said top surface of said insulating layer.

10. An antifuse as in claim 9 wherein said amorphous silicon layer completely separates said metal silicide region from said refractory metal layer.

11. An antifuse as in claim 1 wherein said refractory metal layer comprises tungsten.

12. An antifuse as in claim 11 further comprising a thin layer of material between said amorphous silicon layer and said refractory metal layer, said material selected so as to provide a good contact between said amorphous silicon layer and said refractory metal layer.

13. An antifuse as in claim 12 wherein said thin layer of material comprises titanium-tungsten alloy.

14. An antifuse as in claim 12 wherein said thin layer of material comprises titanium nitride.

15. An antifuse as in claim 12 wherein said thin layer of material comprises a dual-layer of titanium and of titanium nitride.

16. An antifuse as in claim 1 wherein said metal interconnection layer comprises aluminum and said antifuse further comprises a thin layer of conductive material at the bottom of said metal interconnection layer, said conductive material providing a diffusion barrier between aluminum and silicon.

17. An antifuse as in claim 16 wherein said thin layer of conductive material comprises titanium-tungsten alloy.

18. An antifuse as in claim 16 wherein said thin layer of conductive material comprises titanium nitride.

19. An antifuse as in claim 16 wherein said thin layer of conductive material comprises a dual layer of titanium and titanium nitride.

20. Antifuse and contact structures in an integrated circuit device, said structures comprising:
a conducting silicon layer having a top surface;
a relatively thick insulating layer over said silicon layer, said insulating layer having openings therethrough to said conducting silicon layer, said silicon layer having silicide layers on said top surface in said openings where antifuses are located and having no silicide layers where contacts are located;
a relatively thin amorphous silicon layer in said openings where antifuses are located, said amorphous silicon layer covering said metal silicide layers;
a refractory metal layer in said openings where antifuses and contacts are located, said refractory metal layer having a top surface and filling said openings so that said top surface of said refractory metal layer is substantially at the same level as said top surface of said insulating layer; and
a metal interconnection layer on said top surfaces of said insulating layer and said refractory metal layer;
whereby said antifuse and contact structures are formed between said silicon layer and said metal interconnection layer.

21. The structures as in claim 20 wherein said silicon layer comprises a conducting region of a semiconductor substrate.

22. The structures as in claim 20 wherein said silicon layer comprises a layer of epitaxial silicon.

23. The structures as in claim 20 wherein said silicon layer comprises a layer of polysilicon.

24. The structures as in claim 20 wherein said metal silicide layer comprises a metal selected from the group consisting of titanium, tantalum, tungsten, and molybdenum, or cobalt.

25. An antifuse structure as in claim 24 wherein said metal silicide region comprises titanium.

26. The structures as in claim 20 wherein said amorphous silicon layer is in the range of 500 to 1500 Angstroms thick.

27. The structures as in claim 26 wherein said amorphous silicon layer is approximately 800 Angstroms thick.

28. The structures as in claim 20 wherein said amorphous silicon layer comprises hydrogen in the range of 5 to 20% by composition.

29. The structures as in claim 20 wherein said amorphous silicon layer extends onto said top surface of said insulating layer.

30. The structures as in claim 20 wherein said refractory metal layer comprises tungsten.

31. The structures as in claim 30 further comprising a thin layer of conducting material between said amorphous silicon layer and said refractory metal layer in said openings where antifuse and contact structures are located, said material selected so as to provide a good adhesive contact between tungsten and said insulating layer.

32. The structures as in claim 31 wherein said thin layer of conducting material comprises titanium-tungsten alloy.

33. The structures as in claim 31 wherein said thin layer of conducting material comprises titanium nitride.

34. The structures as in claim 31 wherein said thin layer of conducting material comprises a thin layer of titanium and a thin layer of titanium nitride.

35. The structures as in claim 31 wherein said metal interconnection layer comprises aluminum and said structures further comprise a thin conducting layer between said refractory metal layer and said metal interconnection layer, said thin layer comprising titanium-tungsten alloy.

36. The structures as in claim 31 wherein said metal interconnection layer comprises aluminum and said structures further comprise a thin conducting layer between said refractory metal layer and said metal interconnection layer, said thin layer comprising titanium nitride.

37. The structures as in claim 31 wherein said metal interconnection layer comprises aluminum and said structures further comprise first and second thin layers between said refractory metal layer and said metal interconnection layer, said first thin layer comprising titanium, said second thin layer comprising titanium nitride.

38. Antifuse and contact structures in an integrated circuit device, said structures comprising:
a conducting silicon layer having a top surface;
a relatively thick insulating layer over said silicon layer, said insulating layer having openings therethrough to said conducting silicon layer;
a relatively thick refractory metal layer in said openings where antifuses and contacts are located, said refractory metal layer having a top surface and filling said openings so that said top surface of said refractory metal layer is substantially at the same level as said top surface of said insulating layer;
a relatively thin amorphous silicon layer on said top surface of said refractory metal layer in said openings where antifuses are located, said amorphous silicon layer covering said refractory metal layer; and
a metal interconnection layer on said top surfaces of said insulating layer and said amorphous silicon layer;
whereby said antifuse and contact structures are formed between said silicon layer and said metal interconnection layer.

39. The structures as in claim 38 wherein said silicon layer comprises a conducting region of a semiconductor substrate.

40. The structures as in claim 38 wherein said silicon layer comprises a layer of epitaxial silicon.

41. The structures as in claim 38 wherein said silicon layer comprises a layer of polysilicon.

42. The structures as in claim 38 wherein said refractory metal layer comprises tungsten.

43. The structures as in claim 42 further comprising a thin layer of conducting material between said silicon layer and said refractory metal layer in said openings where antifuse and contact structures are located, said material selected so as to provide a good adhesive contact between said insulating layer and said refractory metal layer.

44. The structures as in claim 43 wherein said thin layer of conductive material comprises a titanium-tungsten alloy.

45. The structures as in claim 43 wherein said thin layer of conductive material comprises a dual layer of titanium and titanium nitride.

46. The structures as in claim 38 wherein said amorphous silicon layer is in the range of 500 to 1500 Angstroms thick.

47. The structures as in claim 46 wherein said amorphous silicon layer is approximately 800 Angstroms thick.

48. The structures as in claim 38 wherein said amorphous silicon layer comprises hydrogen in the range of 5 to 20% by composition.

49. The structures as in claim 38 wherein said amorphous silicon layer completely covers said refractory metal layer in said openings in which antifuses are located.

50. The structures as in claim 49 wherein said amorphous silicon layer extends onto said top surface of said insulating layer around said refractory metal layer in said openings in which antifuses are located.

51. The structures as in claim 42 wherein said metal interconnection layer comprises aluminum and said structures further comprise a thin layer between said refractory metal layer and said metal interconnection layer, said thin layer comprising titanium-tungsten alloy.

52. The structures as in claim 42 wherein said metal interconnection layer comprises aluminum and said structures further comprise a thin layer between said refractory metal layer and said metal interconnection layer, said thin layer comprising titanium nitride.

53. The structure as in claim 42 wherein said metal interconnection layer comprises aluminum and said s further comprise first and second thin layers between said refractory metal layer and said metal interconnection layer, said first thin layer comprising titanium, said second thin layer comprising titanium nitride.

* * * * *